(12) United States Patent
Dubey et al.

(10) Patent No.: US 9,721,906 B2
(45) Date of Patent: Aug. 1, 2017

(54) ELECTRONIC PACKAGE WITH CORNER SUPPORTS

(71) Applicant: Intel Corporation, Santa Clara, CA (US)

(72) Inventors: Manish Dubey, Chandler, AZ (US);
Rajendra C. Dias, Phoenix, AZ (US);
Baris Bicen, Chandler, AZ (US);
Digvijay Raorane, Chandler, AZ (US);
Bharat P. Penmecha, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/841,052

(22) Filed: Aug. 31, 2015

(65) Prior Publication Data
US 2017/0062356 A1   Mar. 2, 2017

(51) Int. Cl.
*H01L 23/31* (2006.01)
*H01L 23/00* (2006.01)
*H01L 21/56* (2006.01)

(52) U.S. Cl.
CPC .......... *H01L 23/562* (2013.01); *H01L 21/563* (2013.01); *H01L 23/3142* (2013.01); *H01L 24/32* (2013.01); *H01L 24/83* (2013.01); *H01L 2224/32225* (2013.01); *H01L 2224/83801* (2013.01); *H01L 2924/1511* (2013.01); *H01L 2924/1515* (2013.01); *H01L 2924/3511* (2013.01)

(58) Field of Classification Search
CPC ....... H01L 21/563; H01L 24/31; H01L 24/29; H01L 24/81; H01L 21/00; H01L 23/562; H01L 23/3142; H01L 24/83; H01L 24/32

USPC ................ 257/737, 738, 778, 784, 786, 783
See application file for complete search history.

(56) References Cited

U.S. PATENT DOCUMENTS

| | | | |
|---|---|---|---|
| 6,048,656 A * | 4/2000 | Akram | H01L 21/563 257/787 |
| 2002/0068417 A1 | 6/2002 | Farnworth et al. | |
| 2004/0087061 A1 | 5/2004 | Ma et al. | |
| 2005/0200013 A1 | 9/2005 | Ho | |
| 2007/0178627 A1* | 8/2007 | Jiang | H01L 21/563 438/108 |
| 2009/0236730 A1* | 9/2009 | Topacio | H01L 23/16 257/701 |

(Continued)

OTHER PUBLICATIONS

"International Application Serial No. PCT/US2016/043405, International Search Report mailed Oct. 20, 2016", 3 pgs.

(Continued)

*Primary Examiner* — Alexander Oscar Williams
(74) *Attorney, Agent, or Firm* — Schwegman Lundberg & Woessner, P.A.

(57) ABSTRACT

An electronic package that includes a substrate and a die attached to the substrate. A plurality of supports attached to the substrate adjacent to the die. At least one support in the plurality of supports is positioned adjacent to at least one corner of the die such that the at least one corner of the die is positioned adjacent to the at least one support. Other example forms relate to a method of fabricating an electronic package. The method includes securing a die to a substrate and securing a plurality of supports to the substrate such that at least one support is adjacent to at least one corner of the die.

12 Claims, 7 Drawing Sheets

(56) References Cited

U.S. PATENT DOCUMENTS

| | | | | |
|---|---|---|---|---|
| 2009/0268267 A1* | 10/2009 | Ogasawara | .......... | G11B 7/0065 359/3 |
| 2009/0294978 A1* | 12/2009 | Ota | ....... | H01L 21/563 257/773 |
| 2009/0302427 A1 | 12/2009 | Su et al. | | |
| 2011/0147895 A1 | 6/2011 | Bai et al. | | |
| 2012/0013007 A1* | 1/2012 | Hwang | .................. | H01L 24/32 257/738 |
| 2012/0074589 A1* | 3/2012 | Mardi | .................. | H01L 21/563 257/777 |
| 2014/0353838 A1* | 12/2014 | Lin | ......... | H01L 24/97 257/773 |
| 2015/0155221 A1* | 6/2015 | Chen | ....... | H01L 24/17 257/690 |
| 2015/0357255 A1* | 12/2015 | Lin | ......... | H01L 24/97 257/712 |
| 2016/0005672 A1* | 1/2016 | Dubey | ................. | H01L 21/563 257/778 |

OTHER PUBLICATIONS

"International Application Serial No. PCT/US2016/043405, Written Opinion mailed Oct. 20, 2016", 6 pgs.

* cited by examiner

ELECTRONIC PACKAGE WITH CORNER SUPPORTS

BACKGROUND

Minimizing transistor size in order to keep up with Moore's law continually requires reducing first level interconnect (FLI) pitch and bump size. In addition, using advanced dielectrics has often resulted in utilizing low-k and extremely low-k materials in silicon.

The combination of these factors results in higher sensitivity to stress during assembly and thermo-mechanical stress. Therefore, with each new technological advancement, solutions for reducing thermo-mechanical stress become significantly more important.

With the advent of smaller form factor devices (cellphones, tablets) and their short life expectancy, the reliability requirements for such semiconductor packages has reduced. However, high performance large packages still require good reliability performance because such devices typically have an estimated end life of 5-7 years.

Reliability related fails for large die products, especially due to wide area inter layer dielectric (ILD) delamination and fillet cracks, have increased due to the use of low-k and ultra-low-k ILD materials. Current server products barely meet existing reliability requirements. In addition, many users of large electronic packages require strong reliability performance, especially in harsher physical environments.

FIG. 1 shows ILD delamination 1 that is commonly observed in large die electronic packages 2. This type of ILD delamination 1 in such electronic packages 2 typically occurs due to the stresses that are associated with temperature cycling (TC).

As shown in FIG. 1, this type of ILD delamination 1 is a well-known reliability fail mechanism that initiates from one of the corners 3 of the electronic package 2. The conventional solution to prevent such fails is by improving the properties of the underfill material. However, improving the mechanical properties of the underfill comes with compromises on other desirable properties (e.g. flowability and/or cost).

FIG. 1 shows that as the electronic package 2 gets larger, the corners 3 of the electronic package 2 have the highest distance to neutral point DNP, which results in the highest stress being at the corners 3 of the electronic package 2. Therefore, a need exists for a relatively large electronic package that has good reliability performance under a variety of thermal cycling conditions due to reducing the stress on the corners of the relatively large electronic package.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages and methods described herein may address the need for a relatively large electronic package that has good reliability performance under a variety of thermal cycling conditions due to reducing the stress on the corners of the relatively large electronic package. The basic principle is based on addressing the coefficient of thermal expansion mismatch between the die and substrate and their geometries at different temperatures. The proposed solution adds supports at the corners of the die thereby reducing the stress on the die corners.

Figure 1:
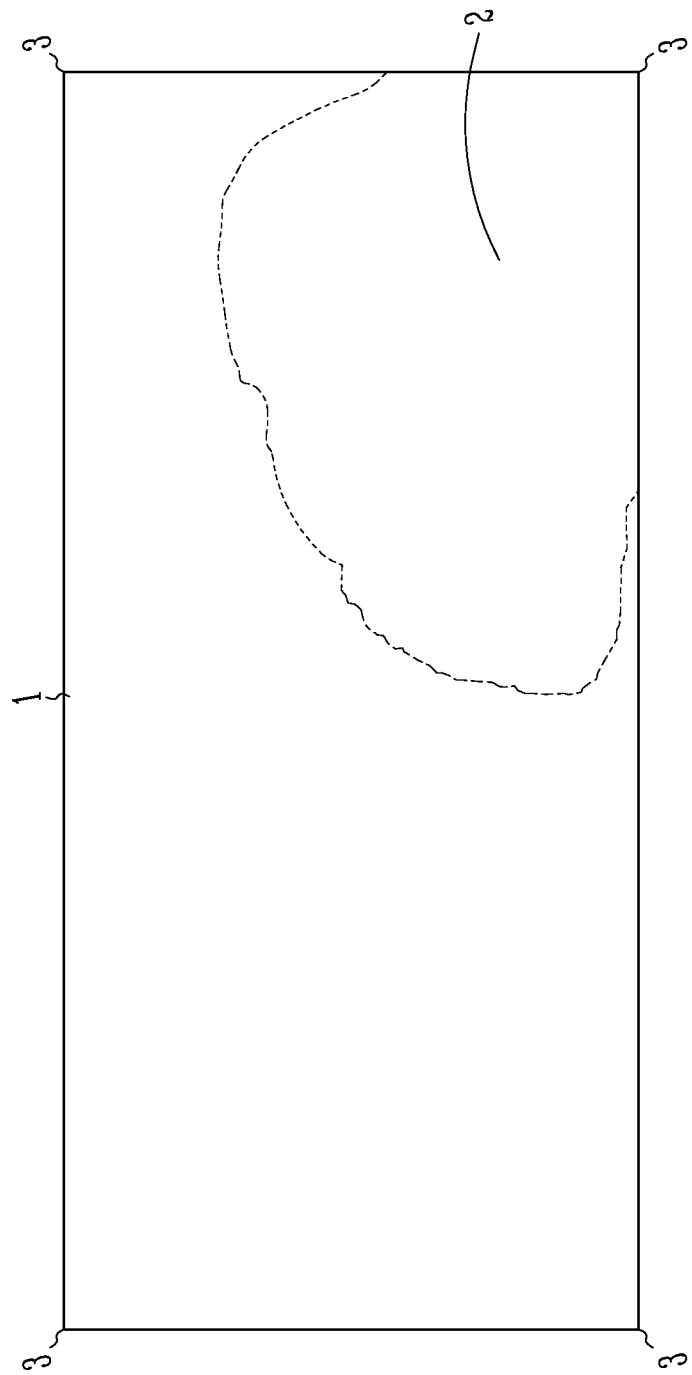
FIG. 1 shows ILD delamination that is commonly observed in conventional large die electronic packages.
Figure 2:
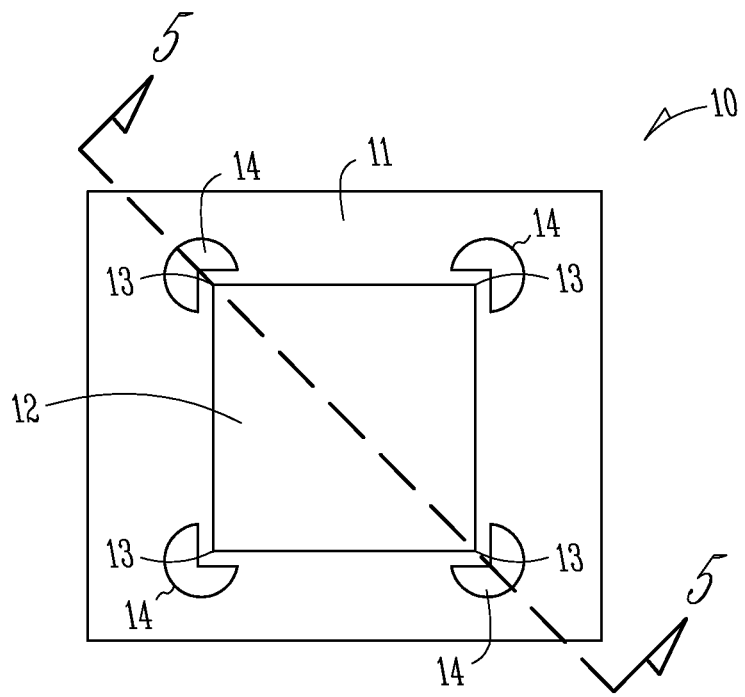
FIG. 2 shows a top view of an example electronic package.
Figure 3:
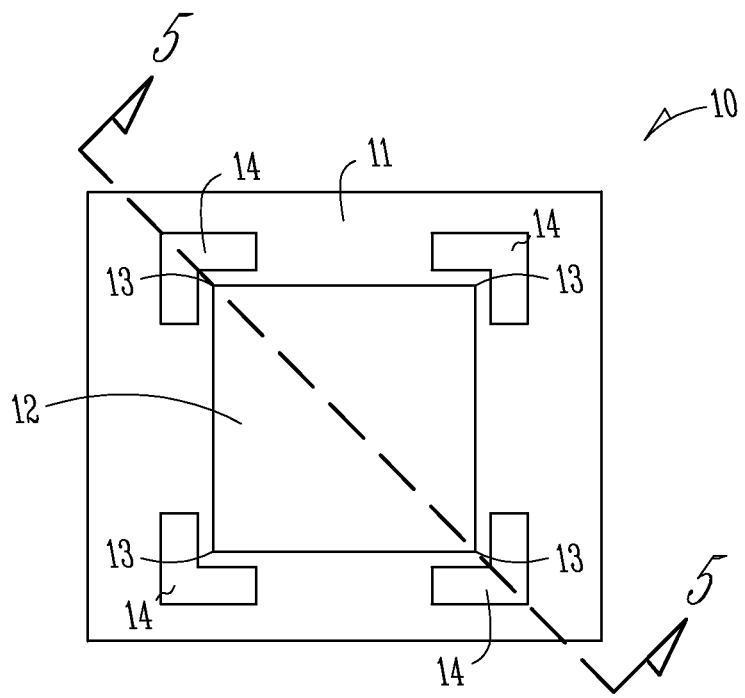
FIG. 3 shows a top view of the example electronic package shown in FIG. 2 with different supports.
Figure 4:
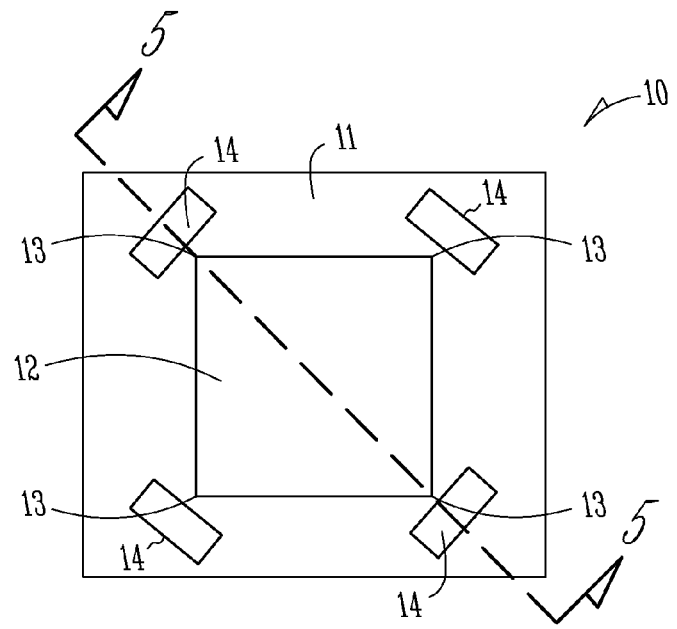
FIG. 4 shows a top view of the example electronic package shown in FIG. 2 with different supports.
Figure 5:
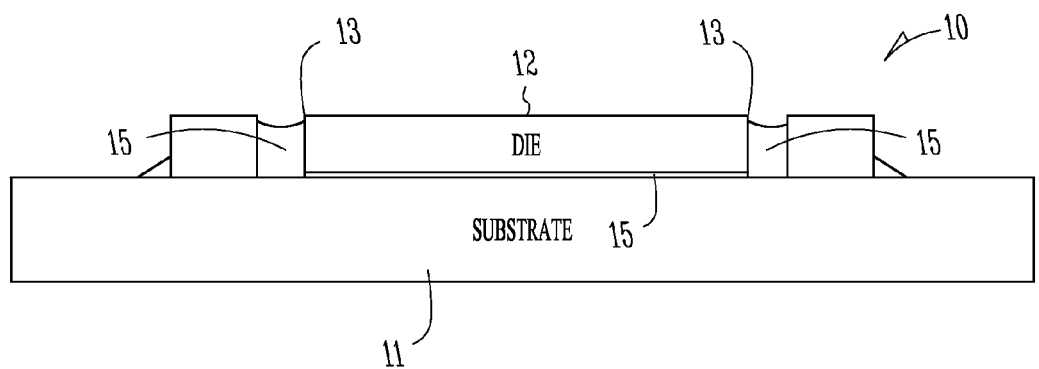
FIG. 5 shows a schematic cross-sectional view of the example electronic package shown in FIGS. 2-4 taken along line 5-5.

FIG. 2 shows a top view of an example electronic package 10. FIG. 3 shows a top view of the example electronic package 10 shown in FIG. 2 with different supports 14. FIG. 4 shows a top view of the example electronic package 10 shown in FIG. 2 with different supports 14. FIG. 5 shows a schematic cross-sectional view of the example electronic package 10 shown in FIGS. 2-4 taken along line 5-5.

The example electronic package 10 includes a substrate 11 and a die 12 attached to the substrate 11. A plurality of supports 14 is attached to the substrate 11 adjacent to the die 12. At least one support 14 in the plurality of supports 14 is positioned adjacent to at least one corner 13 of the die 12 such that the at least one corner 13 of the die 12 is positioned adjacent to the at least one support 14.

The addition of a support 14 next to the die 12 corner 13 may reduce the stress on the die 12 corner 13 at high temperatures. FIGS. 2-4 illustrate different types of example supports 14. It should be noted that other types of supports 14 are contemplated and the size and type of support 14 that is utilized in the electronic package 10 will depend in part on (i) the size and type of die 12; (ii) the size and type of substrate 11; and/or (iii) the size and type of other components on the substrate 11 (among other factors).

Figure 6:
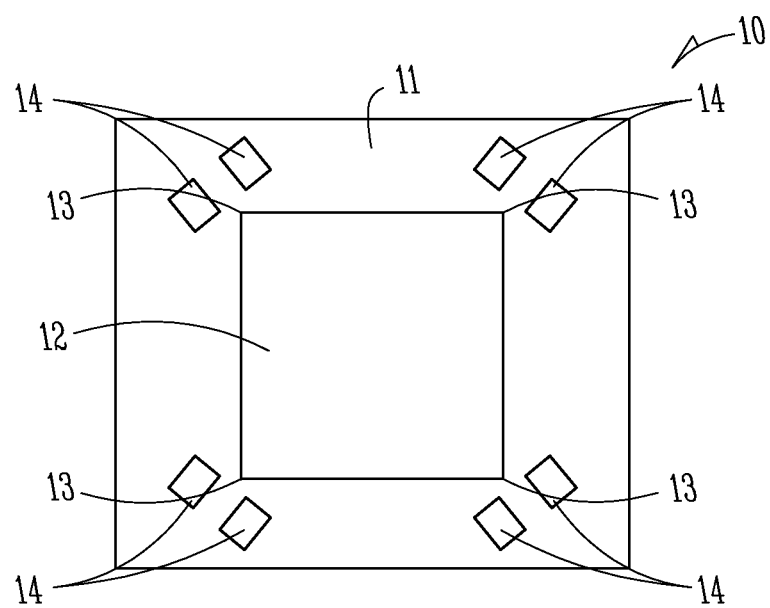
FIG. 6 shows a top view of another example electronic package.

In addition, the supports 14 may be positioned adjacent to one, some or all of the corners 13 of the die 12 in order to reduce stress at the appropriate corners 13 of the die 12. The supports 14 may also all be the same, partially the same, or each support 14 may be different in order to reduce stress at the appropriate corners 13 of the die 12. As shown in FIG. 6, there may also be more than support 14 at one, some, or all of the corners 13 of the die 12.

The supports 14 may be made of material(s) that are optimized to get the best stress reduction at the appropriate corners 13 of the die 12. In some forms, the material may have a lower CTE (e.g., lower than silicon) to obtain the best performance. The supports 14 may be secured to the substrate 11 with an adhesive or may be soldered to the substrate 11. Other ways of fabricating the supports 14 onto the substrate 11 are contemplated.

The example electronic package 10 may further include an underfill 15 between the die 12 and the substrate 11. As an example, the underfill 15 may be the same type of underfill between the die 12 and the substrate 11. The supports 14 may be present on the substrate 11 before or after the die 12 is attached to the substrate 11, and before or after the underfill 15 is placed between the die 12 and the substrate 11.

The electronic packages described herein may reduce stress-related bump cracks and fillet cracks near the corners 13 of the die 12. In addition, reducing these types stress-related bump cracks and fillet cracks may inhibit solder migration in order to improve electronic package reliability (i.e., minimize electrical failures).

Figure 7:
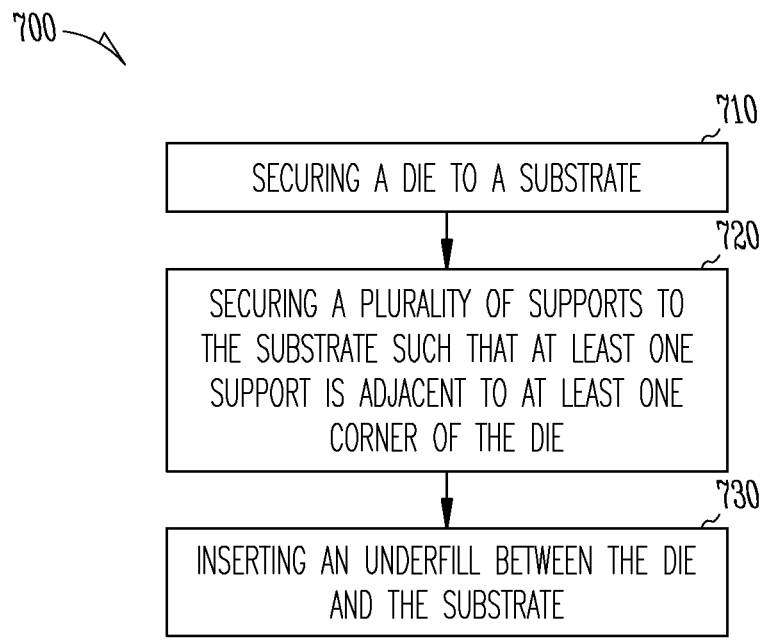
FIG. 7 is a flow diagram illustrating an example method of forming an electronic package.

FIG. 7 is a flow diagram illustrating an example method [700] of forming an electronic package 10. The method [700] includes [710] securing a die 12 to a substrate 11 and [720] securing a plurality of supports 14 to the substrate 11 such that at least one support 14 is adjacent to at least one corner 13 of the die 12. One, some or all of the corners 13 of the die 12 may be positioned adjacent to one support 14 (see FIGS. 2-4) or multiple supports 14 (see FIG. 6).

In some forms, [710] securing a die 12 to a substrate 11 may include adhering the die 12 to the substrate 11 or soldering the die 12 to the substrate 11. Other forms of attaching the die 12 to the substrate 11 are contemplated.

In addition, [720] securing a plurality of supports 14 to the substrate 11 may include attaching (e.g., by adhering or soldering) the plurality of supports 14 to the substrate 11. Other forms of attaching the supports 14 to the substrate 11 are contemplated.

[720] Securing a plurality of supports 14 to the substrate 11 may additionally, or alternatively, include forming the plurality of supports 14 on the substrate 11 (e.g., by etching). Other forms of forming the supports 14 on the substrate 11 are contemplated.

The method [700] may further include [730] inserting an underfill 15 (see FIG. 5) between the die 12 and the substrate 11. In some forms, the underfill 15 may be inserted before the die 12 is placed on the substrate 11. The manner in which the underfill 15 is inserted between the die 12 and the substrate 11 will depend in part on the size and type of die 12 and substrate 11 as well the type of underfill 15 (among other factors).

Figure 8:
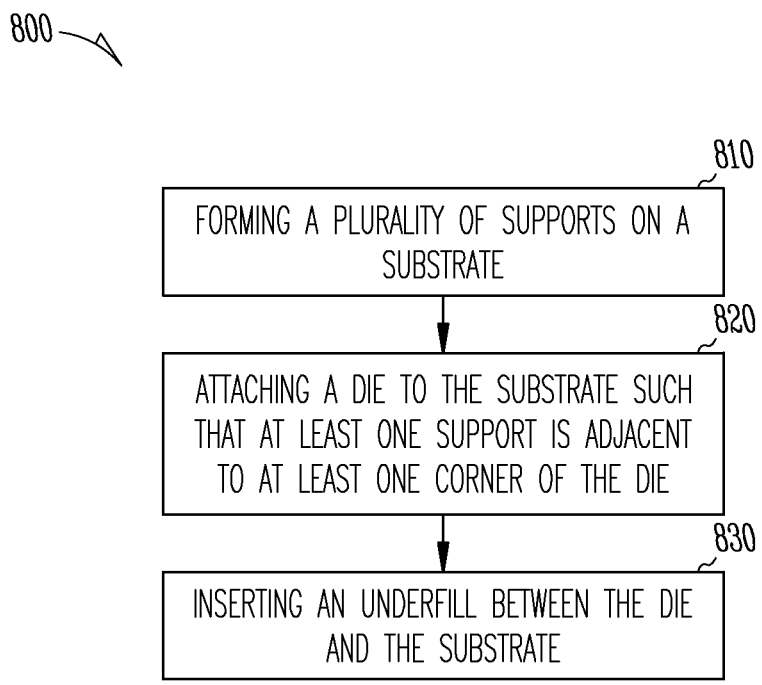
FIG. 8 is a flow diagram illustrating another example method of forming an electronic package.

FIG. 8 is a flow diagram illustrating another example method [800] of forming an electronic package 10. The method [800] includes [810] forming a plurality of supports 14 on a substrate 11 and [820] attaching a die 12 to the substrate 11 (as described above) such that at least one support 14 is adjacent to at least one corner 13 of the die 12. One, some or all of the corners 13 of the die 12 may be positioned adjacent to one support 14 (see FIGS. 2-4) or multiple supports 14 (see FIG. 6).

In some forms, [810] forming the plurality of supports 14 on the substrate 11 may include forming each of the plurality of supports 14 (individually or collectively) into a shape that reduces stress on the corners 13 of the die 12 during operation of the die 12. The supports 14 may also all formed the same, partially the same, or each support 14 may be different in order to reduce stress at the appropriate corners 13 of the die 12.

The method [800] may further include [830] inserting an underfill 15 (see FIG. 5) between the die 12 and the substrate 11. The manner in which the underfill 15 is inserted between the die 12 and the substrate 11 will depend in part on the size and type of die 12 and substrate 11 as well the type of underfill 15 (among other factors).

The electronic packages 10 and methods [700], [800] described herein may greatly enhance the reliability performance of large die electronic packages. The electronic packages 10 and methods [700], [800] described herein may add supports 14 at the appropriate corners 13 of the die 12 thereby reducing the stress on the die 12 corners 13.

Figure 9:
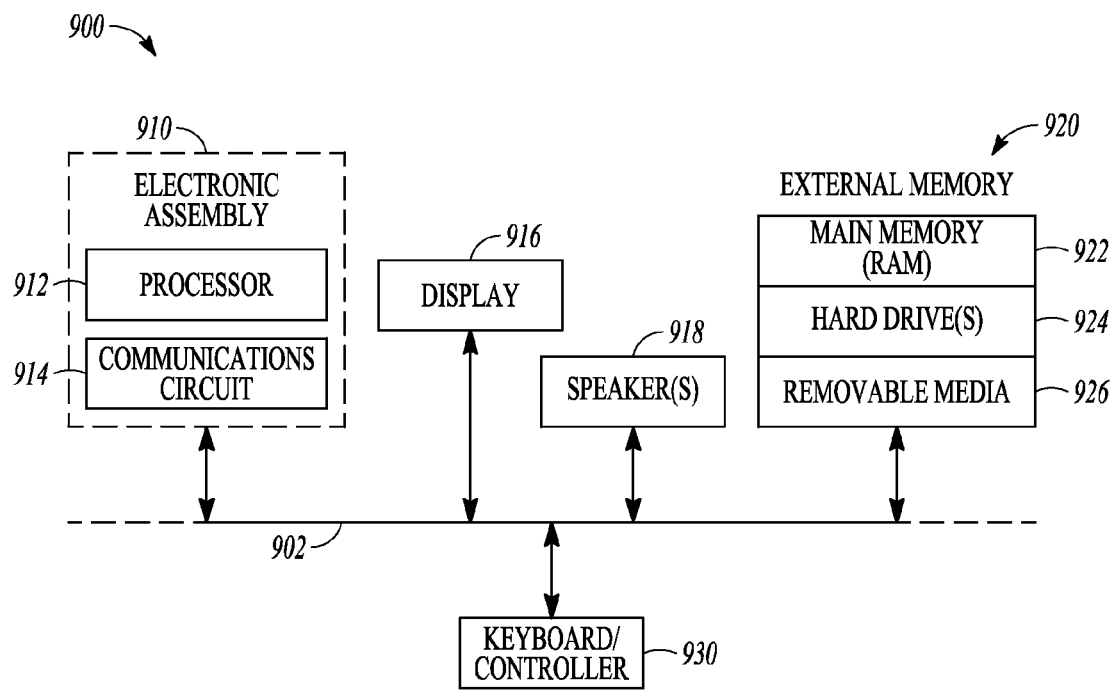
FIG. 9 is a block diagram of an electronic apparatus that includes the electronic packages and/or the methods described herein.

FIG. 9 is a block diagram of an electronic apparatus 900 incorporating at least one electronic package 10 and/or method [700], [800] described herein. Electronic apparatus 900 is merely one example of an electronic apparatus in which forms of the electronic packages 10 and/or methods [700], [800] described herein] may be used.

Examples of an electronic apparatus 900 include, but are not limited to, personal computers, tablet computers, mobile telephones, game devices, MP3 or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 that includes any of the electronic packages 10 and/or methods [700], [800] described herein as describe herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

To better illustrate the method and apparatuses disclosed herein, a non-limiting list of embodiments is provided herein:

Example 1 includes an electronic package. The electronic package includes a substrate and a die attached to the substrate. A plurality of supports attached to the substrate adjacent to the die. At least one support in the plurality of supports is positioned adjacent to at least one corner of the die such that the at least one corner of the die is positioned adjacent to the at least one support.

Example 2 includes the electronic package of example 1, wherein each corner of the die is positioned adjacent to one support.

Example 3 includes the electronic package of any one of examples 1-2, wherein each corner of the die is positioned adjacent to at least one support.

Example 4 includes the electronic package of any one of examples 1-3, wherein each support is secured to the substrate with an adhesive.

Example 5 includes the electronic package of any one of examples 1-4, wherein each support is soldered to the substrate.

Example 6 includes the electronic package of any one of examples 1-5, wherein each support has a similar shape.

Example 7 includes the electronic package of any one of examples 1-6, wherein each support is formed of a single material.

Example 8 includes the electronic package of any one of examples 1-7, and further including an underfill between the die and the substrate.

Example 9 includes a method of fabricating an electronic package. The method includes securing a die to a substrate and securing a plurality of supports to the substrate such that at least one support is adjacent to at least one corner of the die.

Example 10 includes the method of example 9, wherein each corner of the die is positioned adjacent to one support.

Example 11 includes the method of any one of examples 9-10, wherein at least one corner of the die is positioned adjacent to a plurality of supports.

Example 12 includes the method of examples 9-11, wherein securing a die to a substrate includes adhering the die to the substrate.

Example 13 includes the method of any one of examples 9-12, wherein securing a die to a substrate includes soldering the die to the substrate.

Example 14 includes the method of any one of examples 9-13, wherein securing a plurality of supports to the substrate includes attaching the plurality of supports to the substrate.

Example 15 includes the method of any one of examples 9-14, wherein securing a plurality of supports to the substrate includes forming the plurality of supports on the substrate.

Example 16 includes the method of any one of examples 9-15, and further including inserting an underfill between the die and the substrate.

Example 17 includes a method of fabricating an electronic package. The method includes forming a plurality of supports on a substrate and attaching a die to the substrate such that at least one support is adjacent to at least one corner of the die.

Example 18 includes the method of example 17, wherein each corner of the die is positioned adjacent to one support.

Example 19 includes the method of any one of examples 17-18, wherein forming the plurality of supports on the substrate includes forming each of the plurality of supports into a shape that reduces stress on the corners of the die during operation of the die.

Example 20 includes the method of any one of examples 17-19, further comprising inserting an underfill between the die and the substrate.

This overview is intended to provide non-limiting examples of the present subject matter. It is not intended to provide an exclusive or exhaustive explanation. The detailed description is included to provide further information about the electronic packages and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations.

The scope of the invention should be determined with reference to the appended claims, along with the full scope of equivalents to which such claims are entitled.

The invention claimed is:

1. An electronic package comprising:
   a substrate that includes a planar upper surface;
   a die attached to the planar upper surface of the substrate;
   a plurality of supports attached to the planar upper surface of the substrate adjacent to the die, wherein each support in the plurality of supports is positioned adjacent to one corner of the die and each support is not in contact with the die, wherein each support extends along two sides of the die and extends around a corner of the die, wherein each corner of the die is positioned adjacent to one support, wherein each support is secured to the planar upper surface of the substrate with an adhesive, wherein each support is a different material than the adhesive.

2. The electronic package of claim 1, wherein each support has a similar shape.

3. The electronic package of claim 1, further comprising an underfill between the die and the planar upper surface of the substrate.

4. A method of forming an electronic package comprising:
   securing a die to a substrate that includes a planar upper surface; and
   securing a plurality of supports to the planar upper surface of the substrate such that one support is adjacent to each corner of the die and each support is not in contact with the die, wherein each support extends along two side of the dies and around a corner of the die, wherein securing a plurality of supports to the substrate includes soldering the plurality of supports to the planar upper surface of the substrate.

5. The method of claim 4, wherein each corner of the die is positioned adjacent to one support.

6. The method of claim 4, wherein at least one corner of the die is positioned adjacent to a plurality of supports.

7. The method of claim 4, wherein securing a die to a substrate includes adhering the die to the planar upper surface of the substrate.

8. The method of claim 4, wherein securing a die to a substrate includes soldering the die to the planar upper surface of the substrate.

9. The method of claim 4, further comprising inserting an underfill between the die and the planar upper surface of the substrate.

10. An electronic package comprising:
    a substrate that includes a planar upper surface;
    a die attached to the planar upper surface of the substrate;
    a plurality of supports attached to the planar upper surface of the substrate adjacent to the die, wherein each support in the plurality of supports is positioned adjacent to one corner of the die and each support is not in contact with the die, wherein each support extends along two sides of the die and extends around a corner of the die, wherein each corner of the die is positioned adjacent to one support, wherein each support is secured to the planar upper surface of the substrate with solder.

11. The electronic package of claim 10, wherein each support has a similar shape.

12. The electronic package of claim 10, further comprising an underfill between the die and the planar upper surface of the substrate.

* * * * *